United States Patent [19]

Yu et al.

[11] Patent Number: 5,372,891
[45] Date of Patent: Dec. 13, 1994

[54] FLEXIBLE COPPER/POLYIMIDE AND BARBITURIC ACID MODIFIED BISMALEIMIDE BLEND/POLYIMIDE LAMINATE

[75] Inventors: Tsai-An Yu; Jing-Pin Pan, both of Hsinchu; Han-Lung Chen, Nantou Hsien; Jinn-Shing King, Chung Ho; Tsung-Hsiung Wang, Taichung Hsien, all of Taiwan, Prov. of China

[73] Assignee: Industrial Technology Research Institute, Hsinchu, Taiwan, Prov. of China

[21] Appl. No.: 991,287

[22] Filed: Dec. 16, 1992

Related U.S. Application Data

[63] Continuation-in-part of Ser. No. 571,139, Aug. 22, 1990, Pat. No. 5,200,474.

[51] Int. Cl.$^5$ .............................................. B32B 15/08
[52] U.S. Cl. .................................. 428/458; 428/473.5; 525/426; 156/244.11
[58] Field of Search ................. 428/458, 473.5; 525/426; 156/244.11, 244.24, 244.26, 314

[56] References Cited

U.S. PATENT DOCUMENTS

| | | | |
|---|---|---|---|
| 4,097,545 | 6/1978 | Akiyama et al. | 260/830 P |
| 4,675,246 | 6/1987 | Kundinger | 428/458 |
| 4,788,098 | 11/1988 | Sado et al. | 428/473.5 X |
| 4,985,509 | 1/1991 | Matuura et al. | 525/426 |
| 5,200,474 | 4/1993 | Chen et al. | 428/473.5 X |

FOREIGN PATENT DOCUMENTS 158619   5/1991   Taiwan, Prov. of China .

OTHER PUBLICATIONS

Jpn. Kokai Tokyo Koho JP03/123,093, 61131d (CA Selects, Polyimides, Issue 5, 1992).
T. Paskal, et al., "New Semi-Interpenetrating Polymeric Networks from Linear Polyimides and Thermosetting Bismaleimides:2 Mechanical and Thermal Prop. of the blends," Polymer, 1990, vol. 31, Jan. pp. 78–83.

Primary Examiner—D. S. Nakarani
Assistant Examiner—Stephen Sand
Attorney, Agent, or Firm—W. Wayne Liauh

[57] ABSTRACT

An improved polyimide-based coating composition comprising a polyimide upper layer and a polyimide-modified bismaleimide lower layer for use as a coating on metal substrate, such as an electrolytic copper foil. The polyimide are prepared from reactions between diamines, such as p-phenylene diamine and 4-4'-diaminodiphenyl ether, and dianhydrides, such as 3,3',4,4'-benzophenone tetracarboxylic dianhydride and biphenyl-3,3',4,4'-tetracarboxylic dianhydride. The modified bismaleimide can be prepared from reacting an N,N',4,4'-diphenyl bismaleimide with a barbituric acid or its derivative. A double-layered extrusion coating technique having a double-layered extrusion die is utilized to apply the coating composition onto the metal substrate. The final laminated products show improved peel strength between the polyimide coating and the substrate, as well as improved dimensional stability and surface flatness thereof.

8 Claims, 3 Drawing Sheets

FLEXIBLE COPPER/POLYIMIDE AND BARBITURIC ACID MODIFIED BISMALEIMIDE BLEND/POLYIMIDE LAMINATE

This is a continuation-in-part of co-pending application Ser. No. 07/571,139, filed Aug. 22, 1990, now U.S. Pat. No. 5,200,474, Apr. 6, 1993.

BACKGROUND OF THE INVENTION

This invention relates to a polyimide-based coating composition for laminating metal substrate such as copper foil. More particularly, this invention relates to a polyimide-based coating composition for making flexible copper laminate that provides improved adhesion, dimensional stability, and surface flatness, and method of applying the same.

Polyimides have been widely used in the electronics industry as a film coating material on metal substrates. Polyimides are well known for their excellent heat-resisting characteristics. However, there exist several areas that need to be improved regarding the application of polyimides in the electronics industry. Typical of these problem areas include: the degree of adhesion between polyimides and the metal substrate (for example a copper foil), the dimensional stability of the electrolytic copper laminate, and the flatness of the copper laminate surface after being clad with polyimides. Surface flatness determines the closeness at which the circuit line can be packed together. To provide a fine line circuit, a highly flat surface will be required.

A common approach to improve the degree of adhesion between polyimides and the copper foil is to use adhesives. Proper selection of adhesives can also help maintaining the flatness of the copper foil surface. However, most adhesives do not have the same extent of heat resistance as polyimides. The use of adhesives often reduces the temperature range of the final product and, therefore, limits the types of applications that polyimides may be used. The additional step of having to apply adhesives before applying the polyimide coating layer also complicates the manufacturing procedure in making copper laminates. Therefore, it is desirable to develop polyimide compositions that provide good adhesion characteristics between the coating layer and the copper foil without the need to use adhesives, and, at the same time, ensure that the final product has acceptable surface flatness.

PRIOR ART

In an article entitled "New Semi-Interpenetrating Polymeric Networks from Linear Polyimides and Thermosetting Bismaleimides: 2. Mechanical and Thermal Properties of the Blends," authored by T. Pascal, et al, POLYMER, vol. 31, pp 78–83 (1990), bismaleimide was studied as an additive to be blended with polyimides to improve the mechanical properties, such as tensile strength, thereof. However, to use the polyimide-bismaleimide blend as a coating composition, other factors must also be considered, most notably the surface flatness.

In Republic of China, Utility Pat. No. 158,619 (the '619 patent), it was disclosed a bismaleimide and polyimide mixture composition for coating copper foil. The degree of adhesion, measured in terms of peel strength, was increased from 4.5 lb/in when using polyimide alone, to 8 lb/in using the mixture composition. However, the coating composition disclosed in the '619 patent does not address the issue of surface flatness. Surface curling of the copper foil, which is an indication of imperfect surface flatness, was a major problem with the mixture composition disclosed therein.

Japanese Patent App. JP 91-123,093 discloses a method for the manufacture of copper-clad laminate with multi-layer polyimide films for flexible printed circuits. An electrolytic copper foil was coated with more than two layers of polyimides having different thermal expansion coefficients. The inventors claimed that the final product showed no curl; however, no mentioning was made regarding the degree of adhesion between the polyimide coatings and the copper foil.

SUMMARY OF THE INVENTION

The primary object of this invention is to provide a polyimide based film coating composition for flexible copper laminate which exhibits good adhesion characteristics with the copper foil, and is capable of maintaining the dimensional stability and surface flatness of the copper laminate.

The polyimide coating composition disclosed in this invention comprises a polyimide upper layer and a polyimide-bismaleimide lower layer; the two layers are applied onto the copper foil using a double-layered extrusion coating process. In the present invention polyimides can be prepared from reaction between diamines and dianhydrides. Examples of diamines include p-phenylene diamine and 4-4'-diaminodiphenyl ether. Examples of dianhydrides include 3,3',4,4'-benzophenone tetracarboxylic dianhydride and biphenyl 3,3',4,4'-tetracarboxylic dianhydride. In the preferred embodiments, both of the two above-mentioned diamines, i.e., p-phenylene diamine and 4-4'-diaminodiphenyl ether in a predetermined ratio, and both of the two above-mentioned dianhydrides, i.e., 3,3',4,4'-benzophenone tetracarboxylic dianhydride and biphenyl-3,3',4,4'-tetracarboxylic dianhydride in another predetermined ratio, are used as reactants to make the polyimides of the present invention. The reaction of diamines and dianhydrides first forms a prepolymer, poly(amic acid), which becomes polyimide after drying and curing. The ratio between the diamines and the dianhydrides determines the molecular weight of the final polyimide resin. The preferred ratio between the dianhydrides and the diamines ranges from 0.96 to 0.99.

In the preferred embodiment, the bismaleimide, which is mixed with polyimide to form the lower layer coating composition, is a modified bismaleimide prepared from the reaction of the following two types of reactants:

(1) Barbituric acid or its derivative, represented by the following formula:

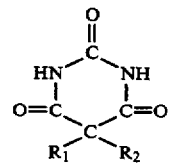

wherein $R_1$ and $R_2$ can be, independently, hydrogen, aliphatic or aromatic groups.

(2) an N,N',4,4'-diphenyl bismaleimide represented by the following formula:

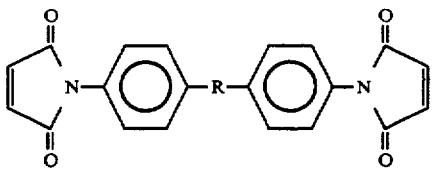

wherein R can be either a methyl group or oxygen.

BRIEF DESCRIPTION OF THE DRAWINGS

The objects and advantages of this invention will become apparent upon reading the following detailed description and upon reference to the drawings in which.

DETAILED DESCRIPTION OF PREFERRED EMBODIMENT

Example 1 (This Invention)

Example 1 is a detailed disclosure of how to make the polyimide-based coating composition of this invention, and the application thereof in making improved copper laminates.

Step 1: Preparation of Polyimide Upper Layer Composition

Reactants p-phenylene diamine (PPDA) and 4,4'-diaminodiphenyl ether (ODA), in a ratio ranging from 0.1 to 0.5, were first dissolved in a mixture solvent containing N-methyl-2-pyrrolidone (NMP) and toluene. The ratio between NMP and toluene ranges from 3 to 5. After complete dissolution, 3,3',4,4'-benzophenone tetracarboxylic dianhydride (BTDA) was added to the solution. About one hour thereafter, biphenyl-3,3',4,4'-tetracarboxylic dianhydride (BPDA) was added into the mixture solution in four installments, each at an interval of 25 minutes. In a preferred embodiment, whose properties are shown in Table 2, the ratio of BPDA/BTDA/PDA/ODA/NMP/toluene, by weight, was 0.8/0.18/0.85/0.15/80/20. The entire reaction took place under a nitrogen environment at room temperature.

Step 2: Preparation of Modified Bismaleimide

The bismaleimide (BMI) that was used to mix with polyimide to make up the lower layer composition was a modified bismaleimide; it was prepared from the reaction between a mixture of barbituric acid and its derivatives, and N,N'-4,4'-diphenyl methane-bismaleimide in a molar ratio between about 1/10 and ⅓. The reaction took place at temperatures between 100° to 130° C., in the presence of an appropriate solvent, for example, NMP, for 0.5 to 6 hours.

Step 3: Preparation of the Polyimide-BMI Lower Layer Composition

The lower layer composition was prepared by mixing polyimide from Step 1 with the modified BMI from Step 2. The amount of BMI used in making the lower layer composition was 5 to 15% of the total composition. In the preferred embodiment, the amount of BMI was 10% of polyimide.

Step 4: Double-layered Extrusion Coating

Figure 1:
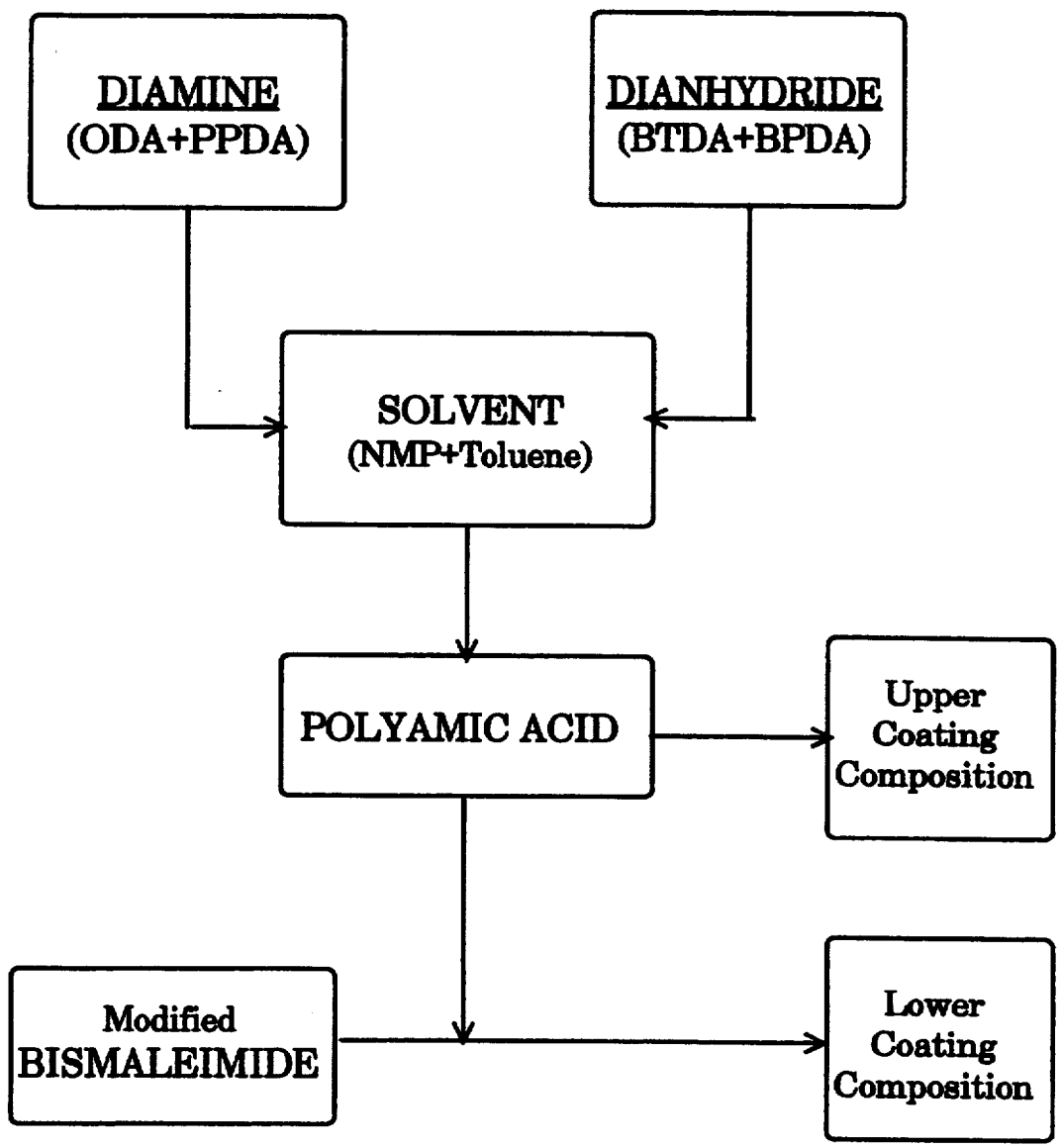
FIG. 1 is a schematic flow chart disclosing the preparation of the polyimide-based coating composition of this invention.
Figure 2:
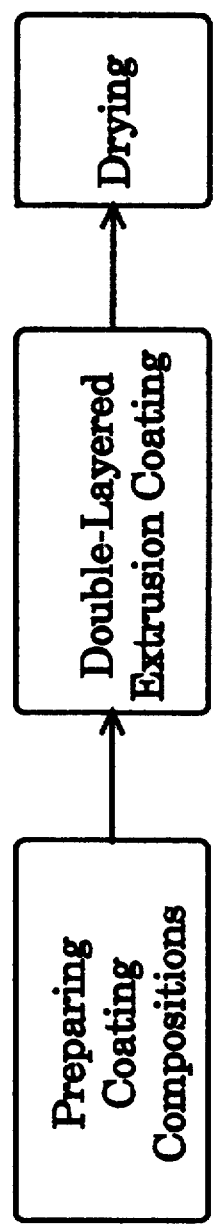
FIG. 2 is a schematic flow chart disclosing the application of the polyimide-based coating composition of this invention.
Figure 3:
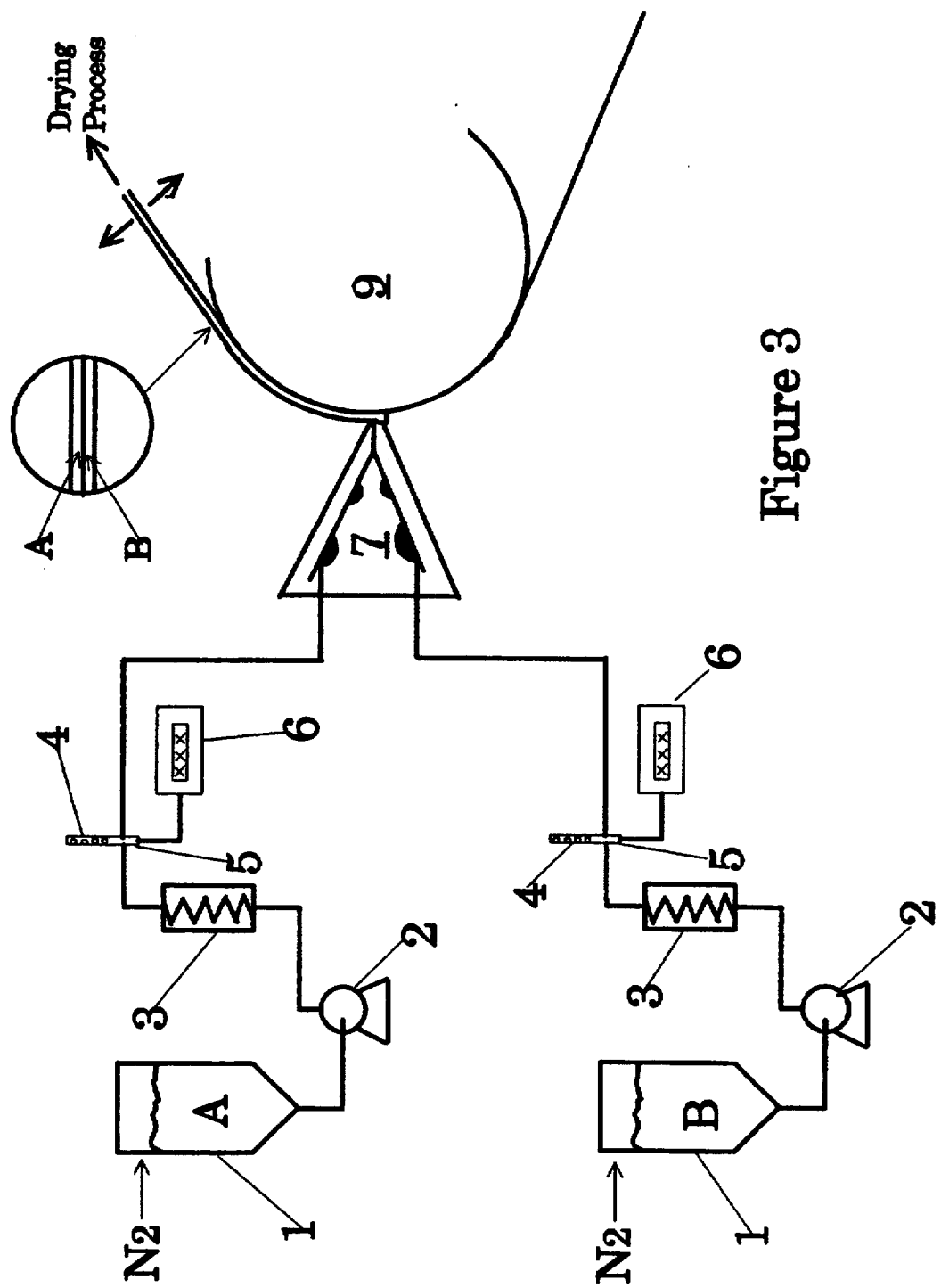
FIG. 3 is a schematic flow chart disclosing the double-layered extrusion coating process used in this invention for making copper laminate.

FIG. 2 shows a schematic of the double-layered extrusion coating process that utilized in this invention in making the copper laminate. Polyimide from Step 1 and the polyimide-BMI from Step 3 described above were stored in storage tanks A and B, respectively. A nitrogen blank was applied in both storage tanks A and B. A gear pump 2 was used to deliver the coating composition from each storage tank. Each of the two coating compositions first passed through a filter 3, then a debubbler 4. A pressure sensor 5 was attached to each of the debubblers 4 to detect any pressure anomaly. The pressure readings were displayed in pressure displays 6. The two coating compositions converged at the double-layered extrusion die 7 before they were applied onto a moving copper foil 8, which was rolled pass the extrusion die 7 by the pulling of a chill roller 9.

The ratio between the thickness of the polyimide upper layer and the thickness of the polyimide-BMI lower layer can range between 1 to 5. In the preferred embodiment, the ratio between the thickness of the polyimide upper layer and the thickness of the polyimide-BMI lower is 1:1. Increasing the thickness of the lower layer increases the tensile strength of the coated product but reduces it surface flatness. Therefore, it is preferred that the upper and lower layers have similar thickness to provide optimum physical and mechanical characteristics of the final products.

The coating conditions during the double-layered extrusion coating process in the preferred embodiment of this invention are summarized in Table 1.

TABLE 1

| | |
|---|---|
| Coating Speed: | 0.3 m/min |
| Film Width: | 10 cm |
| Film Thickness (Dry): | 50 μm (25 μm for each layer) |
| Viscosity of Coating Composition: | 4,500 cp (polyimide) |
| | 4,500 cp (polyimide-BMI) |
| Mass Flowrate of Coating Composition: | 16 g/min: polyimide |
| | 16 g/min: polyimide-BMI |
| Type of Copper Foil: | Electrolyte Copper Foil |
| Coating Gap: | About 200 μm |
| Film Thickness (Wet): | 250 μm for the upper layer |
| | 250 μm for the lower layer |

The double-layered extrusion die has a two-manifold design. The two composition streams merge at a 90-degree angle. Each separate coating composition had at least 95% uniformity before merging. The coating compositions remained in a laminar flow condition after they merged. Due to the laminar flow nature of the coating compositions and their high viscosity, only very small extent of mass transfer through molecular diffusion would be allowed across the interface, but essentially no convective mixing would occur between the two layers.

The coated copper foil was dried in subsequent drying process as indicated in FIG. 2. The drying process was conducted in a nitrogen environment. The temperature history of the drying process is summarized in Table 2.

TABLE 2

| | |
|---|---|
| From room temperature to 150° C.: | 30 minutes |
| at 150° C.: | 30 minutes |
| From 150° C. to 250° C.: | 30 minutes |
| at 250° C.: | 30 minutes |
| From 250° C. to 350° C.: | 30 minutes |
| at 350° C.: | 60 minutes |

TABLE 2-continued

| From 350° C. to room temperature: | 3.5 hours |

Example #2 (Comparative Example, Polyimide layer only)

A copper foil was coated using the same process as described above, except that only polyimide (prepared from Step 1) was used as the coating composition. The final film thickness (dry) was the same as that described above, both are 50 μm.

Example #3 (Comparative Example, Polyimide-BMI layer only)

A copper foil was coated using the same process as described above, except that only polyimide-BMI mixture (prepared from Steps 2 and 3) was used as the coating composition. The final film thickness (dry) was the same at 50 μm.

Comparison of Test Results

Table 3 compares test results performed on the three coated samples using the coating compositions from Example 1 (this invention), comparative Example #2 and comparative Example #3. The tests performed included: peel strength, dimensional stability, tensile strength, elongation, curl radius (a measure of surface flatness of the coated foil), and thermal expansion coefficient.

TABLE 3

|  | Example 1 (This Invention) | Example #2 (Comparative) | Example #3 (Comparative) |
|---|---|---|---|
| Peel Strength (lb/in) | 10.0 | 4.5 | 10.0 |
| Tensile Strength (Kg/mm$^2$) | 25 | 20 | 27 |
| Elongation | 56% | 60% | 50% |
| Dimensional Stability (25° C., 30 min.) | 0.17% | 0.1% | 0.34% |
| Curl radius (cm) | ∞ | ∞ | 6 |
| Thermal Expansion coefficient (10$^{-6}$/°C., 50–250° C.) | 18 | 20 | 18 |

Table 3 illustrates the advantages of this invention. The polyimide-only coating composition, which is shown as comparative Example #2, indicates the adhesion problems. The peel strength measured for the polyimide-only coating was 4.5 lb/in. The polyimide-BMI coating composition, which is shown as comparative Example 3, improved the adhesion between the polymer coating and the copper foil. The peel strength for the polyimide-BMI coating composition was improved to 10 lb/in.; however, it suffered serious problems in surface flatness. The curl radius of the polyimide-BMI coated copper foil was measured to be 6 cm. Both the double-layered coating composition of this invention and the polyimide-only coating composition showed no curl, i.e., infinite radius of curling. However, the double-layered coating composition showed a peel strength of 10 lb/in, a substantial improvement over the polyimide-only composition.

Table 3 also shows that the addition of a modified bismaleimide improved tensile strength over the polyimide-only composition. This is illustrated in the second (this invention) and the fourth (comparative Example #2) columns. The values of tensile strength measured for these two cases are, 25 and 27 Kg/mm$^2$, respectively, compared to 20 Kg/mm$^2$ for the case of using polyimide-only composition. In order to obtain desired peel and tensile strengths of the coated product, a minimum thickness must be provided for the lower layer (the polyimide-BMI layer). However, a minimum thickness must also be provided for the upper layer (the polyimide layer), in order to maintain desired surface flatness. The preferred ratio between the thickness of the upper layer and that of the lower layer is from 1 to 5.

The double-layered coating composition of this invention also shows a favorable thermal expansion coefficient of $18 \times 10^{-6}$/°C. This is very close to the thermal expansion coefficient of copper foil, $17.8 \times 10^{-6}$/°C. Such a proximity in thermal expansion coefficient reduces thermal stress between the coating composition and the metal substrate during temperature change.

The foregoing description of a preferred embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the an to utilize the invention in various embodiments and with various modifications as are suited to the particular us contemplated. All such modifications and variations are within the scope of the invention as determined by the appended claims when interpreted in accordance with the breadth to which they are fairly, legally and equitably entitled.

What is claimed is:

1. A laminate comprising:
   (a) a copper substrate,
   (b) an upper layer consisting essentially of a polyimide resin, and
   (c) a lower layer disposed between said upper layer and said copper substrate, wherein the lower layer consisting essentially of a mixture of said polyimide resin, which made up said upper layer, and a barbituric acid modified bismaleimide.

2. The laminate of claim 1 wherein said polyimide resin is prepared from the reaction between one or more diamine compounds and one or more dianhydride compounds.

3. The laminate of claim 2 wherein the molar ratio between said dianhydride and said diamine ranges between 0.96 and 0.99.

4. The laminate of claim 2 wherein said diamine compound is selected from the group consisting essentially of p-phenyl diamine and 4,4'-diaminodiphenyl ether.

5. The laminate of claim 2 wherein said dianhydride compound is selected from the group consisting essentially of 3,3',4,4'-benzophenonetetracarboxylic dianhydride and biphenyl-3,3',4,4'-tetracarboxylic dianhydride.

6. The laminate of claim 1 wherein polyimide resin is prepared from the following process:
   (a) adding p-phenylene diamine and 4,4'-diaminodiphenyl ether at a predetermined ratio into a mixture solvent consisting essentially of N-methyl-2-pyrrolidone and toluene;

(b) adding 3,3',4,4'-benzophenonetetracarboxylic dianhydride into the mixture solution prepared from step (a); and
(c) gradually adding biphenyl-3,3',4,4'-tetracarboxylic dianhydride into the solution prepared from step (b).

7. The laminate of claim 1 wherein said bismaleimide is a modified bismaleimide prepared from the reaction between the following two groups of compounds:
(a) Barbituric acid or its derivative, represented by the following formula:

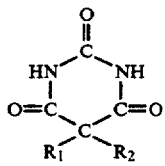

wherein $R_1$ and $R_2$ can be selected independently from the group consisting of hydrogen, aliphatic or aromatic groups; and
(b) an N,N',4,4'-diphenyl bismaleimide represented by the following formula:

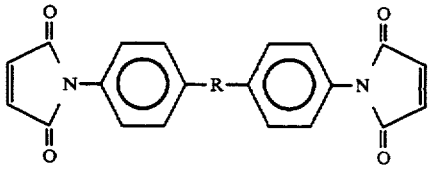

wherein R can be either methyl group or oxygen.

8. The laminate of claim 1 wherein said upper layer and said lower layer being simultaneously applied onto said copper substrate in a double-layered coating process.

* * * * *